(12) United States Patent
Tsai et al.

(10) Patent No.: US 6,879,030 B2
(45) Date of Patent: Apr. 12, 2005

(54) STRENGTHENED WINDOW-TYPE SEMICONDUCTOR PACKAGE

(75) Inventors: Shiann-Tsong Tsai, Hsinchu (TW); Yu-Ming Hsu, Hsinchu (TW); Wen-Lung Wu, Hsinchu (TW); Kuen-Huang Chen, Hsinchu (TW); Wen-Sheng Su, Hsinchu (TW); Chin-Hsing Lin, Hsinchu (TW)

(73) Assignee: Ultratera Corporation, Taiwan (CN)

( * ) Notice: Subject to any disclaimer, the term of this patent is extended or adjusted under 35 U.S.C. 154(b) by 0 days.

(21) Appl. No.: 10/262,309

(22) Filed: Sep. 30, 2002

(65) Prior Publication Data
US 2004/0061209 A1 Apr. 1, 2004

(51) Int. Cl.[7] .............................................. H01L 23/02
(52) U.S. Cl. ...................................................... 257/680
(58) Field of Search ................................ 257/680–687, 257/678, 708, 734, 777, 723

(56) References Cited

U.S. PATENT DOCUMENTS

| | | | |
|---|---|---|---|
| 6,440,772 B1 * | 8/2002 | Smith ........................ 438/106 |
| 6,445,077 B1 * | 9/2002 | Choi et al. .................. 257/786 |
| 6,555,919 B1 * | 4/2003 | Tsai et al. ................... 257/777 |
| 6,601,294 B1 * | 8/2003 | Jiang et al. ................... 29/841 |
| 6,614,102 B1 * | 9/2003 | Hoffman et al. ............ 257/666 |
| 2003/0194830 A1 * | 10/2003 | Chung ........................ 438/106 |

* cited by examiner

Primary Examiner—Hoai Pham
Assistant Examiner—Nathan W. Ha
(74) Attorney, Agent, or Firm—Fulbright & Jaworski LLP

(57) ABSTRACT

A strengthened window-type semiconductor package is provided. A substrate having an opening is mounted with at least a chip in a manner that, an active surface of the chip covers and partly exposed to the opening, and electrically connected to the substrate by bonding wires formed through the opening. An elastic non-conductive material is applied over the chip exclusive of the active surface. An upper encapsulant is formed to encapsulate the chip and the non-conductive material, and a lower encapsulant is formed to encapsulate the bonding wires and seal the opening. With provision of the non-conductive material for encapsulating the chip before forming the upper encapsulant, the chip can be prevented from cracking particularly at corner and edge positions that encounter relatively greater thermal stress during subsequent fabrication processes such as curing of the upper encapsulant and thermal cycles.

13 Claims, 2 Drawing Sheets

STRENGTHENED WINDOW-TYPE SEMICONDUCTOR PACKAGE

FIELD OF THE INVENTION

The present invention relates to window-type semiconductor packages, and more particularly, to a strengthened window-type ball grid array (WBGA) semiconductor package for enhancing mechanical strength of a chip mounted therein.

BACKGROUND OF THE INVENTION

Window-type semiconductor packages are advanced packaging technology, characterized by forming at least an opening penetrating through a substrate, allowing a chip to be mounted over the opening, and electrically connected to the substrate by bonding wires through the opening. One benefit achieved by this window-type package structure is to shorten length of the bonding wires, thereby making electrical transmission or performances between the chip and the substrate more efficiently implemented.

A window-type ball grid array (WBGA) semiconductor package 1 is illustrated in FIG. 4, wherein a substrate 10 has an upper surface 100 and a lower surface 101, and is formed with an opening 102 penetrating through the same. A chip 11 is mounted on the upper surface 100 of the substrate 10 in a face-down manner that, an active surface 110 of the chip 11 faces toward and covers the opening 102, allowing bond pads 111 formed on the active surface 110 to be exposed to the opening 102. A plurality of bonding wires 12 are formed through the opening 102 and bonded to the exposed bond pads 111 of the chip 11, so as to electrically connect the active surface 110 of the chip 11 to the lower surface 101 of the substrate 10. Then, a lower encapsulant 13 is formed on the lower surface 101 of the substrate 10 by a printing process, for encapsulates the bonding wires 12 and sealing the opening 102. And, an upper encapsulant 14 is formed on the upper surface 100 of the substrate 10 by a molding process for encapsulating the chip 11. Finally, a plurality of solder balls 15 are implanted on the lower surface 101 of the substrate 10 at area outside the lower encapsulant 13, and serve as input/output (I/O) ports of the semiconductor package 1 for electrically connecting the chip 11 to an external device such as printed circuit board (PCB, not shown).

However, due to material mismatch in coefficient of thermal expansion (CTE) between the upper encapsulant 14 (formed by a resin compound such as epoxy resin) and the chip 11 directly in contact with the upper encapsulant 14, under a high temperature condition such as curing of the upper encapsulant 14 or subsequent thermal cycles, the chip 11 particularly at corner or edge positions thereof would be subject to relatively greater thermal stress from the upper encapsulant 14. This may thereby cause cracks of the chip 11 at the corner and edge positions, and undesirably extend to damage other area of the chip 11; such a case may more seriously and easily occur for relatively longer or larger chips, and adversely degrade quality and the yield of fabricated package products.

SUMMARY OF THE INVENTION

A primary objective of the present invention is to provide a strengthened window-type semiconductor package, for enhancing mechanical strength of a chip mounted therein and for preventing chip cracks from occurrence.

In accordance with the above and other objectives, the present invention proposes a strengthened window-type semiconductor package, comprising: a substrate having an upper surface and a lower surface opposed to the upper surface, and formed with at least an opening penetrating through the upper and lower surfaces; at least a chip having an active surface and a non-active surface opposed to the active surface, wherein the active surface is mounted over the opening on the upper surface of the substrate, allowing a conductive area of the active surface to be exposed to the opening; a non-conductive material applied over the chip exclusive of the active surface; a plurality of bonding wires formed through the opening for electrically connecting the conductive area of the chip to the lower surface of the substrate; an upper encapsulant formed on the upper surface of the substrate for encapsulating the chip and the non-conductive material; a lower encapsulant formed on the lower surface of the substrate for encapsulating the bonding wires and sealing the opening; and a plurality of solder balls implanted on the lower surface of the substrate and situated outside the lower encapsulant.

The above semiconductor package provides significant benefits. With provision of the non-conductive material for encapsulating the chip before forming the upper encapsulant, the chip would be enhanced in mechanical strength and provided with buffer effect by the elastic non-conductive material in response to subsequent thermal stress. Therefore, under a high temperature condition such as curing of the upper encapsulant or subsequent thermal cycles, the strengthened chip would be prevented from cracking particularly at corner and edge positions that normally encounter relatively greater thermal stress if the chip is naked to the upper encapsulant, such that structural intactness of the chip as well as quality and yield of the semiconductor packages can be desirably assured.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Preferred embodiments for a semiconductor package proposed in the present invention are described in more detail as follows with reference to FIGS. 1A–1E, 2 and 3.

First Preferred Embodiment

FIGS. 1A–1E illustrate fabrication processes for a semiconductor package 2 according to a first embodiment of the invention.

Figure 1A:
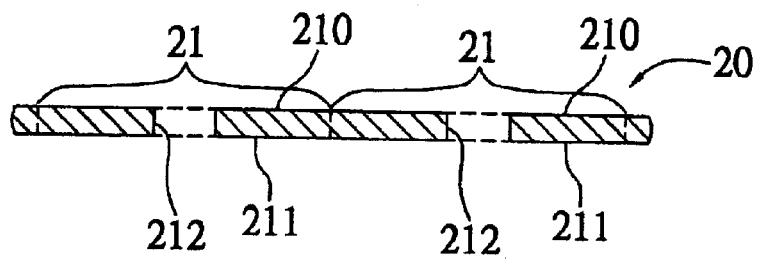
FIGS. 1A–1E are schematic diagrams showing fabrication processes for a semiconductor package according to a first preferred embodiment of the invention.

Referring to FIG. 1A, the first step is to prepare a substrate plate 20 integrally formed of a plurality of substrates 21, which are bordered by dotted lines in the drawing. Each of the substrates 21 has an upper surface 210 and a lower surface 211 opposed to the upper surface 210, and is formed with at least an opening 212 penetrating through the upper and lower surfaces 210, 211. The substrate plate 20 is primarily made of a conventional resin material, such as epoxy resin, polyimide, BT (bismaleimide triazine) resin, FR-4 resin, etc.

Figure 1B:
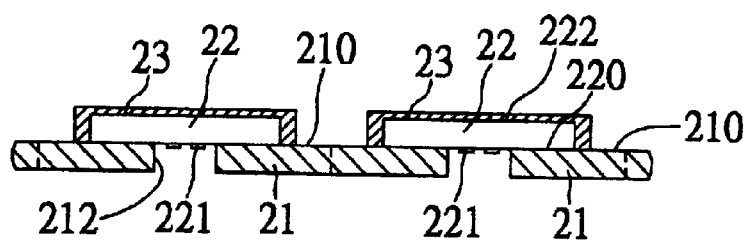
Figure 1B:
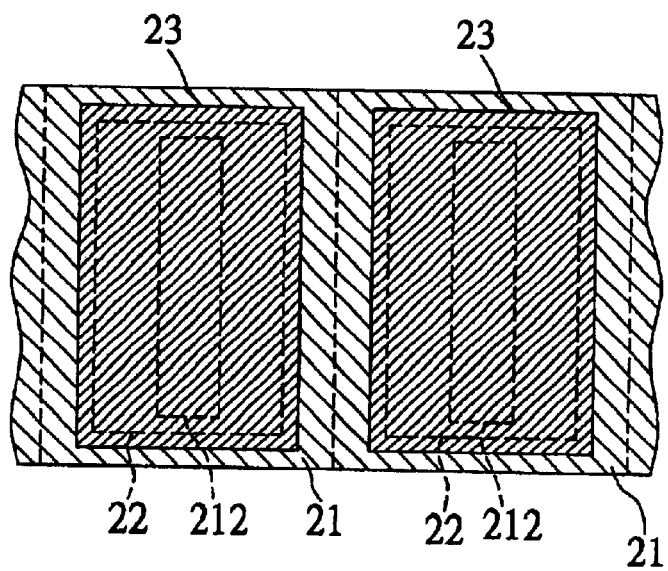

Referring to FIG. 1B, the next step is to mount at least a chip 22 on the upper surface 210 of each of the substrates 21. The chip 22 has an active surface 220 where a plurality of electronic elements and circuits (not shown) and bond pads 221 are formed, and a non-active surface 222 opposed to the active surface 220. The active surface 220 of the chip 22 is disposed over the opening 212 on the upper surface 210 of the corresponding one of the substrates 21, allowing the bond pads 221 on the active surface 220 to be exposed to the opening 212.

Then, further as shown in FIG. 1B (the lower part of FIG. 1B is a top view of the upper part), a non-conductive material 23, preferably an elastic material, is applied over the chip 22 exclusive of the active surface 220 in a manner that, the non-conductive material 23 covers entirely the chip 22 except the active surface 220 attached to the corresponding substrate 21.

Application of the elastic non-conductive material 23 may be implemented by a stencil-printing process, wherein a conventional stencil (not shown) is employed for allowing the non-conductive material 23 to be selectively printed over the chips 22. Since stencil-printing technology is conventional in the art, it is not to be further detailed herein. Moreover, conventional dispensing technology may also be adopted for applying the non-conductive material 23. It should be understood that, other techniques or processes suitable for use with the non-conductive material 23 are encompassed within the scope of this invention.

Figure 1C:
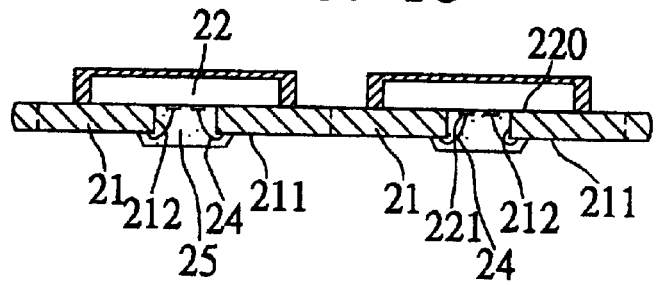

Referring to FIG. 1C, a wire-bonding process is performed to form a plurality of bonding wires 24 such as gold wires through the opening 212 of each of the substrates 21, wherein the bonding wires 24 are bonded to the bond pads 221 on the active surface 220 of the chip 22 and to the lower surface 211 of the corresponding one of the substrates 21, so as to allow the chip 22 to be electrically connected to the corresponding substrate 21 by the bonding wires 24.

Alternatively, application of the non-conductive material 23 may be performed after the wire-bonding process; in other words, after the chip 22 is mounted on each of the substrates 21, the bonding wires 24 are formed for electrical connection purpose, and then, the non-conductive material 23 is applied over the chip 22. It should be noted that, the non-conductive material 23 is preferably employed before a subsequent printing process for encapsulating the bonding wires 24.

Then, a printing process is performed to form a lower encapsulant 25 on the lower surface 211 of each of the substrates 21 in a manner that, the lower encapsulant 25 encapsulates the corresponding bonding wires 24 and seals the opening 212 of the corresponding one of the substrates 21. The printing process is conventional technology, and thus not to be further detailed herein.

Figure 1D:
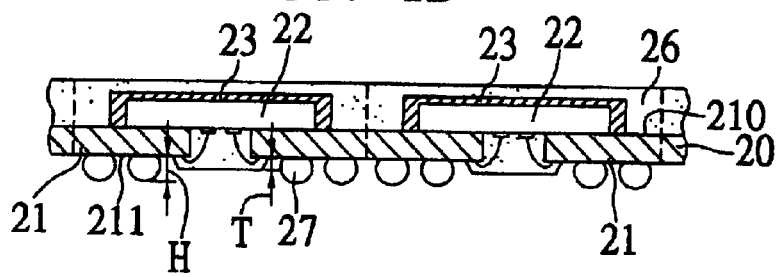

Referring to FIG. 1D, a molding process is performed to form an upper encapsulant 26 on the upper surfaces 210 of the substrates 21, so as to allow all the chips 22 and the non-conductive material 23 to be encapsulated by the upper encapsulant 26 that is made of a conventional resin compound such as epoxy resin.

It should be understood that, the non-conductive material 23 may be alternatively adapted to have its top exposed to outside of the upper encapsulant 26, and thus the upper encapsulant 26 can be reduced in thickness for facilitating profile miniaturization.

Then, a ball-implantation process is performed to implant a plurality of solder balls 27 on the lower surfaces 211 of the substrates 21, wherein the solder balls 27 are situated outside the lower encapsulants 25, and dimensioned in height H larger than thickness T of the lower encapsulants 25 protruding from the lower surfaces 211 of the substrates 21, i.e. H>T. The solder balls 27 may serve as input/output (I/O) ports for electrically connecting the chips 22 to an external device such as printed circuit board (PCB, not shown).

Figure 1E:
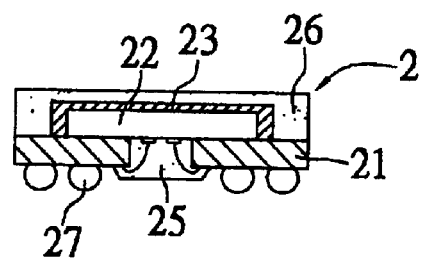

Referring to FIG. 1E, finally, a singulation process is carried out to cut through the upper encapsulant 26 and the substrate plate 20 along dotted lines shown in FIG. 1D, so as to separate apart the substrates 21 and to form a plurality of individual semiconductor packages 2.

The above semiconductor packages 2 provides significant benefits. With provision of the elastic non-conductive material 23 for encapsulating the chip 22 before forming the upper encapsulant 26, the chip 22 would be enhanced in mechanical strength and provided with buffer effect by the elastic non-conductive material 23 in response to subsequent thermal stress. Therefore, under a high temperature condition such as curing of the upper encapsulant 26 or subsequent thermal cycles, the strengthened chip 22 would be prevented from cracking particularly at corner and edge positions that normally encounter relatively greater thermal stress if the chip 22 is naked to the upper encapsulant 22, such that structural intactness of the chip 22 as well as quality and yield of the semiconductor packages 2 can be desirably assured.

Second Preferred Embodiment

Figure 2:
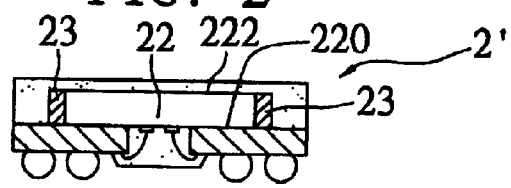
FIG. 2 is a cross-sectional view of a semiconductor package according to a second preferred embodiment of the invention.

FIG. 2 illustrates a semiconductor package 2' according to a second preferred embodiment of the invention. This semiconductor package 2' is structurally similar to the above semiconductor package 2 of the first preferred embodiment; therefore, same components are here designated with same reference numerals as those used in the above first embodiment for easy interpretation and illustration.

The semiconductor package 2' herein differs from the above semiconductor package 2 in that, the non-active surface 222 of the chip 22 is not covered by the non-conductive material 23. Therefore, the non-conductive material 23 encapsulates peripheral sides 223 of the chip 22 exclusive of the active and non-active surfaces 220, 222, but still sufficiently covers corner and edge positions of the chip 22. As the non-conductive material 23 is reduced in thickness for exposing the non-active surface 222 of the chip 22, overall package thickness can thus be desirably reduced, as well as fabrication costs of the semiconductor package 2' are decreased in terms of less usage of the non-conductive material 23.

Third Preferred Embodiment

Figure 3:
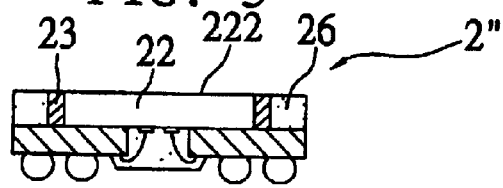
FIG. 3 a cross-sectional view of a semiconductor package according to a third preferred embodiment of the invention.
Figure 4:
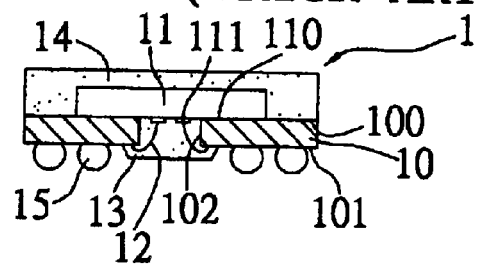
FIG. 4 (PRIOR ART) is a cross-sectional view of a conventional semiconductor package.

FIG. 3 illustrates a semiconductor package 2" according to a third preferred embodiment of the invention.

This semiconductor package 2" differs from the above semiconductor package 2' of the second preferred embodiment in that, the non-active surface 222 of the chip 22 is further exposed to outside of the upper encapsulant 26. Therefore, the non-active surface 222 of the chip 22, not covered by the non-conductive material 23 or the upper encapsulant 26, is directly in contact with the atmosphere for facilitating dissipation of heat generated from the chip 22 during operation, thereby effectively improving heat dissipating efficiency of the semiconductor package 2". Moreover, with the upper encapsulant 26 being reduced in thickness for exposing the non-active surface 222 of the chip 22, overall package thickness can thus be desirably reduced.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A strengthened window-type semiconductor package, comprising:
    a substrate having an upper surface and a lower surface opposed to the upper surface, and formed with at least an opening penetrating through the upper and lower surfaces;
    at least a chip having an active surface and a non-active surface opposed to the active surface, wherein the active surface is mounted over the opening on the upper surface of the substrate, allowing a conductive area of the active surface to be exposed to the opening;
    a non-conductive material applied over the chip exclusive of the active surface for encapsulating peripheral side of the chip;
    a plurality of bonding wires formed through the opening for electrically connecting the conductive area of the chip to the lower surface of the substrate;
    an upper encapsulant formed on the upper surface of the substrate for encapsulating the chip and the non-conductive material; and
    a lower encapsulant formed on the lower surface of the substrate for encapsulating the bonding wires and sealing the opening.

2. The semiconductor package of claim 1, further comprising: a plurality of solder balls implanted on the lower surface of the substrate and situated outside the lower encapsulant.

3. The semiconductor package of claim 1, wherein the non-conductive material is elastic.

4. The semiconductor package of claim 1, wherein the non-conductive material completely covers the chip except the active surface of the chip.

5. The semiconductor package of claim 1, wherein the non-conductive material is exposed at top thereof to outside of the upper encapsulant.

6. The semiconductor package of claim 1, wherein the non-active surface of the chip is exposed to outside of the non-conductive material.

7. The semiconductor package of claim 6, wherein the non-active surface of the chip is exposed to outside of the upper encapsulant.

8. The semiconductor package of claim 1, wherein the non-conductive material is applied in a printing manner.

9. The semiconductor package of claim 1, wherein the non-conductive material is applied in a dispensing manner.

10. The semiconductor package of claim 1, wherein the conductive area of the chip is formed with a plurality of bond pads where the bonding wires are bonded.

11. The semiconductor package of claim 1, wherein the upper encapsulant is formed in a molding manner.

12. The semiconductor package of claim 1, wherein the lower encapsulant is formed in a printing manner.

13. The semiconductor package of claim 2, wherein height of the solder balls is larger than thickness of the lower encapsulant protruding from the lower surface of the substrate.

* * * * *